US012532621B2

(12) United States Patent
Wei et al.

(10) Patent No.: US 12,532,621 B2
(45) Date of Patent: Jan. 20, 2026

(54) DISPLAY MODULE AND DISPLAY DEVICE

(71) Applicants: Yunnan Invensight Optoelectronics Technology Co., Ltd., Yunnan (CN); BOE Technology Group Co., Ltd., Beijing (CN)

(72) Inventors: Junbo Wei, Beijing (CN); Shengji Yang, Beijing (CN); Pengcheng Lu, Beijing (CN); Kuanta Huang, Beijing (CN); Yuanlan Tian, Beijing (CN)

(73) Assignees: Yunnan Invensight Optoelectronics Technology Co., Ltd., Yunnan (CN); BOE Technology Group Co., Ltd., Beijing (CN)

(*) Notice: Subject to any disclaimer, the term of this patent is extended or adjusted under 35 U.S.C. 154(b) by 429 days.

(21) Appl. No.: 18/016,679

(22) PCT Filed: Feb. 28, 2022

(86) PCT No.: PCT/CN2022/078238
§ 371 (c)(1),
(2) Date: Jan. 18, 2023

(87) PCT Pub. No.: WO2023/159556
PCT Pub. Date: Aug. 31, 2023

(65) Prior Publication Data
US 2024/0244902 A1 Jul. 18, 2024

(51) Int. Cl.
H05K 1/02 (2006.01)
H05K 1/18 (2006.01)
H10K 59/131 (2023.01)

(52) U.S. Cl.
CPC .......... *H10K 59/131* (2023.02); *H05K 1/028* (2013.01); *H05K 1/189* (2013.01); *H05K 2201/10128* (2013.01)

(58) Field of Classification Search
CPC ........ H05K 1/028; H05K 1/189; H05K 1/147; H05K 2201/09063; H05K 2201/09036; H05K 2201/055; H05K 2201/10128
See application file for complete search history.

(56) References Cited

U.S. PATENT DOCUMENTS 4,716,259 A * 12/1987 Tokura .................. H05K 1/028
174/254
11,064,604 B1 * 7/2021 Goldin .................. H05K 1/181
(Continued)

FOREIGN PATENT DOCUMENTS

CN 105144270 A 12/2015
CN 110212089 A 9/2019
(Continued)

Primary Examiner — Roshn K Varghese
(74) Attorney, Agent, or Firm — Ling Wu; Stephen Yang; Ling and Yang Intellectual Property

(57) ABSTRACT

A display module includes a display substrate and a flexible circuit board bonding-connected with the display substrate, wherein the flexible circuit board is bent to a side of the display substrate away from a display side; the flexible circuit board includes a bent region and non-bent regions located at both sides of the bent region; the bent region includes a bending axis, the flexible circuit board is bent along the bending axis, the bent region is provided with one or more openings at a position of the bending axis, and the openings are through holes penetrating the flexible circuit board or grooves not penetrating the flexible circuit board; the bent region includes at least one wiring layer, the wiring layer of the bent region includes multiple traces extending to the non-bent regions on both sides of the bent region, and the plurality of traces do not overlap with the openings.

12 Claims, 5 Drawing Sheets

(56) References Cited

U.S. PATENT DOCUMENTS

| | | | |
|---|---|---|---|
| 2007/0019076 A1* | 1/2007 | Teramoto | H05K 1/028 |
| | | | 348/E5.025 |
| 2014/0217373 A1 | 8/2014 | Youn et al. | |
| 2014/0354900 A1* | 12/2014 | Qian | H05K 1/028 |
| | | | 174/254 |
| 2020/0401197 A1* | 12/2020 | Asada | H05K 1/118 |

FOREIGN PATENT DOCUMENTS

| | | |
|---|---|---|
| CN | 113467120 A | 10/2021 |
| JP | 2009-259929 A | 11/2009 |

\* cited by examiner

DISPLAY MODULE AND DISPLAY DEVICE

CROSS-REFERENCE TO RELATED APPLICATION

The present application is a U.S. National Phase Entry of International Application PCT/CN2022/078238 having an international filing date of Feb. 28, 2022, and the contents disclosed in the above-mentioned application are hereby incorporated as a part of this application.

TECHNICAL FIELD

Embodiments of the disclosure relate to, but are not limited to, the field of display technologies, and more particularly to a display module and a display device.

BACKGROUND

Micro Organic Light-Emitting Diode (Micro-OLED) is a micro-display developed in recent years, and a silicon OLED is one of them. Silicon-based OLED has advantages such as small size and high resolution, and is manufactured by mature complementary metal oxide semiconductor (CMOS) integrated circuit technology. It can not only realize active addressing of pixels, but also realize the manufacturing of pixel driving circuit on a silicon substrate, timing control (TCON) circuit and overcurrent protection (OCP) circuit, which is conducive to reducing a system volume and realize lightweight. Silicon-based OLEDs are widely used in virtual reality (VR), augmented reality (AR) and other near-eye display fields, such as AR/VR head-mounted display devices.

Flexible circuit board is used in some silicon-based OLED display devices to transmit external signals to the display substrate. In order to match the structure of the whole machine and minimize a volume of a display module, the flexible circuit board may be designed to be bendable, but it is easy to cause damages to a bent area of the flexible circuit board, which may lead to problems such as low service life and poor signal transmission.

SUMMARY

The following is a summary of subject matter described herein in detail. The summary is not intended to limit the protection scope of claims.

An embodiment of the present disclosure provides a display module, including a display substrate and a flexible circuit board bonding-connected with the display substrate, wherein the flexible circuit board is bent to a side of the display substrate away from a display side; the flexible circuit board includes a bent region and non-bent regions located at two sides of the bent region; the bent region includes a bending axis, the flexible circuit board is bent along the bending axis, the bent region is provided with one or more openings at a position on the bending axis, and the one or more openings are through holes penetrating the flexible circuit board or grooves without penetrating the flexible circuit board; the bent region includes at least one wiring layer, the wiring layer of the bent region includes multiple traces extending to the non-bent regions on the two sides of the bent region, and the plurality of traces do not overlap with the one or more openings.

An embodiment of the present disclosure further provides a display device, which includes the display module.

Other aspects may be understood upon reading and understanding the drawings and the detailed description.

BRIEF DESCRIPTION OF DRAWINGS

Accompanying drawings are intended to provide a further understanding of technical solutions of the present disclosure and form a part of the specification, and are used to explain the technical solutions of the present disclosure together with embodiments of the present disclosure, and not intended to form limitations on the technical solutions of the present disclosure. Shapes and sizes of various components in the drawings do not reflect actual scales, and are only intended to schematically illustrate the contents of the present disclosure.

DETAILED DESCRIPTION

Those of ordinary skills in the art should understand that modifications or equivalent replacements may be made to the technical solutions of the embodiments of the present disclosure without departing from the spirit and scope of the technical solutions of the embodiments of the present disclosure, and should all fall within the scope of the claims of the present disclosure.

Figure 1:
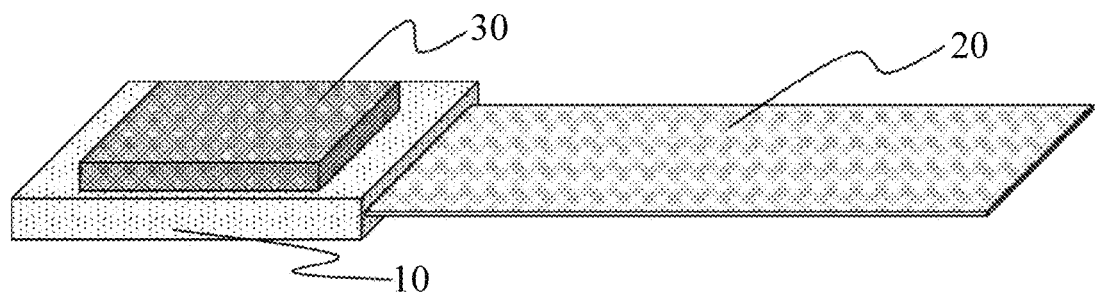
FIG. 1 is a schematic structural diagram of a display module according to some exemplary embodiments.
Figure 2:
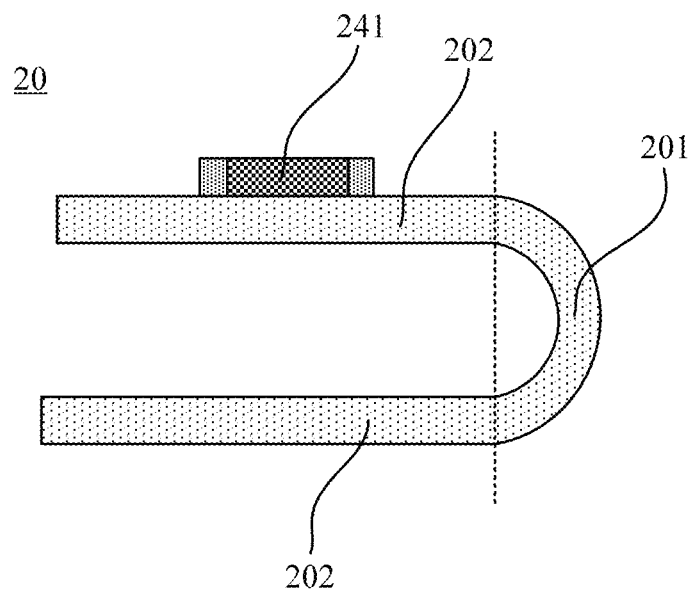
FIG. 2 is a schematic structural diagram of a flexible circuit board of the display module of FIG. 1 in a bent state according to some exemplary embodiments.

As shown in FIG. 1, FIG. 1 is a schematic structural diagram of a display module according to some exemplary embodiments. The display module includes a display substrate 10, a flexible circuit board 20 bonding-connected with the display substrate 10, and a cover plate 30 disposed on a display side of the display substrate 10. One end of the flexible circuit board 20 is bonding-connected with the display substrate 10, and the other end of the flexible circuit board may be bent to a side of the display substrate 10 facing away from the display side. The flexible circuit board 20 in FIG. 1 is in a state before bending. As shown in FIG. 2, FIG. 2 is a schematic structural diagram of a flexible circuit board 20 of the display module of FIG. 1 in a bent state according to some exemplary embodiments. The flexible circuit board 20 may include a bent region 201 and non-bent regions 202 located on two sides of the bent region 201. One end of one of the non-bent regions 202 away from the bent region 201 is bonding-connected with the display substrate 10, and one end of the other non-bent region 202 away from the bent region 201 is bent to a side of the display substrate 10 away from the display side. The bent region 201 may have a generally arc-shaped structure. A non-bent region 202 is provided with an electronic component 241, and wiring of the bent region 201 is configured to electrically connect the non-bent regions 202 on the two sides.

Figure 3:
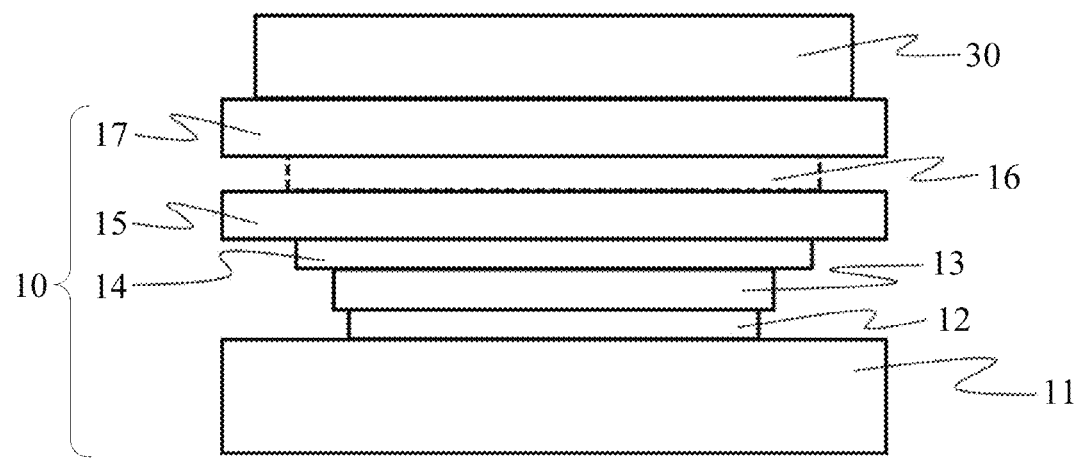
FIG. 3 is a schematic diagram of a film layer structure and structure of a cover plate of a display substrate of the display module of FIG. 1 according to some exemplary embodiments.

As shown in FIG. 3, FIG. 3 is a schematic structural diagram of a film layer structure and a structure of a cover plate of a display substrate of the display module of FIG. 1 according to some exemplary embodiments. The display substrate 10 may include a driving backplate 11, and an anode 12, a light emitting functional layer 13, a cathode layer 14, a first encapsulation layer 15, a color filter layer 16, and a second encapsulation layer 17 that are sequentially stacked on the driving backplate 11. The driving backplate 11 may include a base substrate and a driving circuit layer disposed on the base substrate. The driving circuit layer includes a pixel driving circuit, and the pixel driving circuit may include multiple transistors and capacitors. The anode 12, the light emitting functional layer 13 and the cathode layer 14 are sequentially stacked to form a light emitting device. One end of the display substrate 10 may be provided with a binding pad, which is bonding-connected with the flexible circuit board 20, and the flexible circuit board 20 is configured to be connected with an external circuit to provide a driving signal to the display substrate 10 for display.

Exemplarily, the display substrate 10 may be a silicon-based OLED display substrate, the base substrate may be a silicon substrate, and the pixel driving circuit may be manufactured using a CMOS integrated circuit process, and may be manufactured by a 180 nm or 110 nm semiconductor process. The light emitting device may be a white light OLED device and may be a series-type OLED device structure. The anode 12 of the light emitting device may be made of a metal or/and metal oxide material having electrical conductivity and a high work function value. The anode 12 may be in a single-layer structure or a multi-layer structure, for example, the anode 12 may include a first titanium metal layer, an aluminum or silver metal layer, a second titanium metal layer, and an indium tin oxide (ITO) layer that are sequentially stacked in a direction away from the driving backplate 11. The cathode layer 14 of the light emitting device may be made of a magnesium-silver alloy or the like. The first encapsulation layer 15 and the second encapsulation layer 17 may be made of one or more of an organic material and an inorganic material having good sealing performance. The inorganic material may be, for example, silicon oxide, silicon nitride, or the like. The first encapsulation layer 15 and the second encapsulation layer 17 may serve a function of blocking water vapor and oxygen and protecting the light emitting device from water and oxygen erosion. The color filter layer 16 may include multiple filter units capable of transmitting light of a set color, for example, including a red filter unit capable of transmitting red light, a green filter unit capable of transmitting green light, and a blue filter unit capable of transmitting blue light. The white light emitted by each light emitting device passes through a corresponding filter unit and then emits light of a corresponding color, so as to achieve colorized displaying of the display substrate 10. The cover plate 30 may be covered on the second encapsulation layer 17 of the display substrate 10, and the cover plate 30 may be made of a high transmittance material, such as glass.

Figure 4:
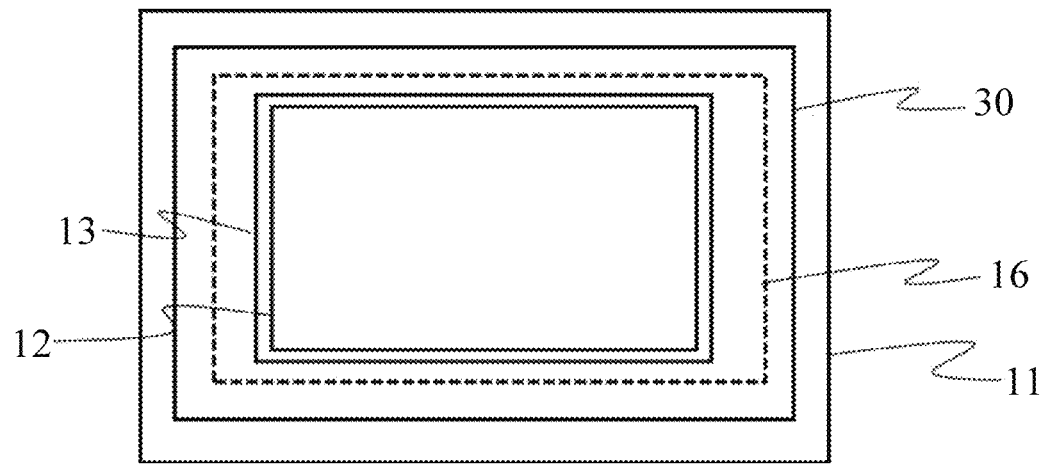
FIG. 4 is a schematic diagram of a planar structure of a display substrate and a cover plate of the display module of FIG. 1 according to some exemplary embodiments.

As shown in FIG. 4, FIG. 4 is a schematic diagram of a planar structure of a display substrate and a cover plate of the display module of FIG. 1 according to some exemplary embodiments. The display substrate 10 includes a display region and a non-display region located around the display region. The cover plate 30 completely covers the display region of the display substrate 10, a peripheral edge of the display substrate 10 may protrude from a peripheral edge of the cover plate 30, and a certain distance is left around a periphery of the display substrate 10 without being covered by the cover plate 30, which may be used for positioning and fixing the display module in the whole device. An orthographic projection of the light emitting functional layer 13 on the driving backplate 11 may include an orthographic projection of the anode 12 of the light emitting device on the driving backplate 11. An orthographic projection of the color filter layer 16 on the driving backplate 11 may include an orthographic projection of the light emitting functional layer 13 on the driving backplate 11.

Figure 5A:
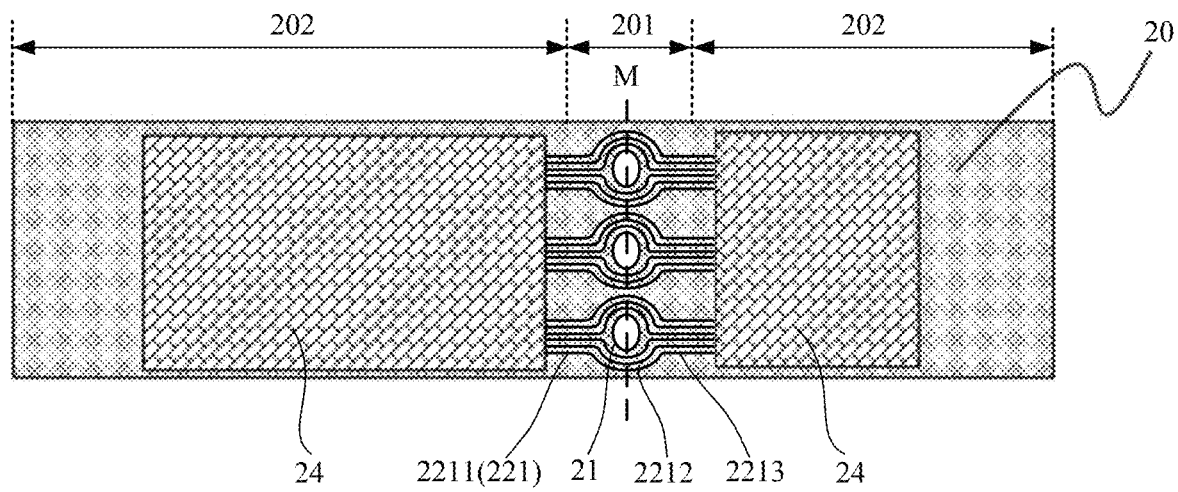
FIG. 5a is a schematic diagram of a planar structure of a flexible circuit board of the display module of FIG. 1 according to some exemplary embodiments.

As shown in FIG. 5a, FIG. 5a is a schematic diagram of a planar structure of a flexible circuit board of the display module of FIG. 1 according to some exemplary embodiments. The display module includes a display substrate 10 and a flexible circuit board 20 bonding-connected with the display substrate 10. The flexible circuit board 20 is bent to a side of the display substrate 10 away from a display side. The flexible circuit board 20 includes a bent region 201 and non-bent regions 202 located on two sides of the bent region 201. The bent region 201 includes a bending axis M, and the flexible circuit board 20 is bent along the bending axis M. The bent region 201 is provided with one or more openings 21 at the bending axis M, and the one or more openings 21 are through holes penetrating the flexible circuit board 20 or grooves without penetrating the flexible circuit board 20. The bent region 201 includes at least one wiring layer, the wiring layer of the bent region 201 includes multiple traces extending to the non-bent regions 202 on two sides of the bent region 201, and the traces do not overlap with the openings 21.

According to the display module of the embodiment of the present disclosure, one or more openings 21 are provided the bending axis M of the bent region 201 of the flexible circuit board 20, the one or more openings 21 are through holes penetrating the flexible circuit board 20 or grooves without penetrating the flexible circuit board 20, and the traces in the bent region 201 do not overlap with the openings 21. In this way, the flexible circuit board 20 may release stress by the openings 21 after being bent along the bending axis M, a risk of damage to the bent region 201 caused by the flexible circuit board 20 after bending is reduced, thus good signal transmission of the flexible circuit board 20 is ensured, a service life is prolonged, which is also advantageous to design a distance between the components in the non-bent region 202 and the bent region 201 to be smaller, so as to reduce the size of the flexible circuit board, and make a bending radius of the flexible circuit board 20 smaller (up to 0.5 mm), which is beneficial to a miniaturization design of the display module.

In some exemplary embodiments, as shown in FIG. 5a, the bent region 201 includes multiple traces 221. Each of the traces 221 includes a first straight-line segment 2211, an intermediate segment 2212, and a second straight-line segment 2213 that are connected in sequence. The first straight-line segment 2211 and the second straight-line segment 2213 are both disposed perpendicular to the bending axis M, and the intermediate segment 2212 is located at a periphery of an opening 21. A straight line perpendicular to the bending axis M and passing through a geometric center of the opening 21 is taken as a central axis of the opening 21, the multiple traces symmetrically disposed with respect to the central axis of the opening 21 are taken as a group of traces, and the multiple traces 221 in each group do not overlap.

In this embodiment, each group of traces in the bent region 201 of the flexible circuit board 20 are symmetrically disposed with respect to the central axis of the opening 21, and each of the traces 221 in each group includes a first straight-line segment 2211, an intermediate segment 2212, and a second straight-line segment 2213 that are connected in sequence, the first straight-line segment 2211 and the second straight-line segment 2213 are both disposed perpendicular to the bending axis M, and the intermediate segment 2212 is located at a periphery of the opening 21. Such a wiring design may reduce the risk of damage to the traces 221 of the bent region 201, and enhance the reliability of electrical connection of the traces 221 of the bent region 201.

In some exemplary embodiments, the intermediate segment may be a polygon or an arc. The intermediate segment may be smoothly connected with the first straight-line segment, and the intermediate segment may be smoothly connected with the second straight-line segment. A shape of the intermediate segment may be adapted to a shape of the opening. The first straight-line segment and the second straight-line segment may be located on a same straight line.

Exemplarily, the shape of the opening may include any one or more of a circle, an ellipse, a rectangle (which may be a rounded rectangle with a quadrangular arc transition), and a hexagon, and the opening is disposed symmetrically with the bending axis as the symmetrical axis. One or more of the openings may be provided, and the shapes of the multiple openings may be the same or different.

In an example of the present embodiment, as shown in FIG. 5a, the non-bent region 202 on either side of the bent region 201 is provided with an electronic component region 24, and various electronic components may be provided in the electronic component region 24. The traces of the bent region 201 may electrically connect the electronic component regions 24 of the non-bent regions 202 on the two sides of the bent region 201. The bent region 201 is provided with multiple (three in the example) openings 21, all of the three openings 21 are elliptical in shape, and dimensions of a minor axis and a major axis of an elliptical opening 21 may be 0.1 mm to 0.3 mm. The three openings 21 are sequentially disposed in the direction of the bending axis M, and each of the openings 21 is symmetrically disposed with the bending axis M as the symmetrical axis. The traces of the bent region 201 include three groups of traces, wherein each group includes multiple traces 221 symmetrically disposed with respect to a central axis of the opening 21. Adjacent traces 221 in each group have a certain spacing so that each of the traces 221 does not short-circuit with the adjacent trace 221 when bent, and the multiple traces 221 in each group do not overlap. In a direction parallel to the bending axis M, a distance between two adjacent groups of traces may be greater than a distance between adjacent traces 221 in each group of traces. A shape of the intermediate segment 2212 of the trace 221 in each group of traces is an arc, and the shape of the intermediate segment 2212 is adapted to the shape of the opening 21. In the trace 221, the intermediate segment 2212 and the first straight-line segment 2211 may be smoothly connected by a circular arc, and the intermediate segment 2212 and the second straight-line segment 2213 may be smoothly connected by a circular arc.

Figure 5B:
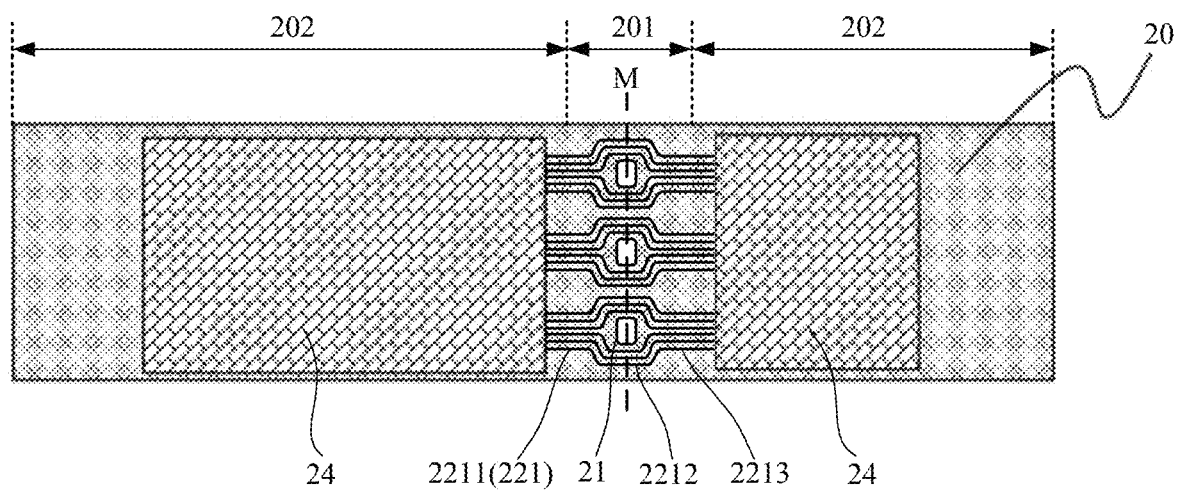
FIG. 5b is a schematic diagram of a planar structure of a flexible circuit board of the display module of FIG. 1 according to some other exemplary embodiments.

In another example of this embodiment, as shown in FIG. 5b, FIG. 5b is a schematic diagram of a planar structure of a flexible circuit board of the display module of FIG. 1 according to some other exemplary embodiments. The bent region 201 is provided with multiple (three in this example) openings 21, all of the three openings 21 are rectangular in shape, the three openings 21 are sequentially disposed in the direction of the bending axis M, and each of the three openings 21 is symmetrically disposed with the bending axis M as the symmetrical axis. The traces of the bent region 201 include three groups of traces, wherein each group includes multiple traces 221 symmetrically disposed with respect to a central axis of the openings 21. Adjacent traces 221 in each group have a certain spacing so that each of the traces 221 does not short-circuit with the adjacent trace 221 when being bent, and the multiple traces 221 in each group do not overlap. In a direction parallel to the bend axis M, a distance between two adjacent groups of traces may be greater than a distance between adjacent traces 221 in each group of traces. A shape of the intermediate segment 2212 of the trace 221 in each group of traces is a polyline, and the shape of the intermediate segment 2212 is adapted to the shape of the openings 21. In the trace 221, the intermediate segment 2212 and the first straight-line segment 2211 may be smoothly connected by a circular arc, and the intermediate segment 2212 and the second straight-line segment 2213 may be smoothly connected by a circular arc.

Figure 6:
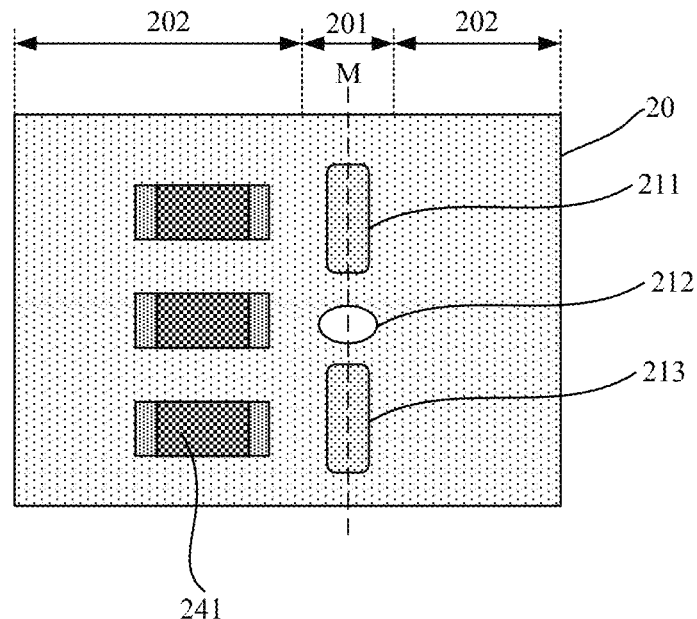
FIG. 6 is a schematic diagram of a planar structure of a flexible circuit board of the display module of FIG. 1 according to some other exemplary embodiments.

In some exemplary embodiments, as shown in FIG. 6, FIG. 6 is a schematic diagram of a planar structure of a flexible circuit board of the display module of FIG. 1 according to some other exemplary embodiments. The bent region 201 is provided with multiple (three in this example) openings 21. The multiple openings 21 include a first groove 211, a through hole 212, and a second groove 213 that are sequentially disposed along a direction of the bending axis M. A length of the first groove 211 or the second groove 213 in a direction parallel to the bending axis M is greater than a width of the first groove 211 or the second groove 213 in a direction perpendicular to the bending axis M. In this example, an opening with through-hole structure is provided in the middle of the bent region 201, and openings with groove structure are provided near edges of two sides of the bent region 201, so that on the one hand, a stress in the bent region 201 may be better released, and on the other hand, a mechanical strength of the flexible circuit board 20 may be ensured.

Figure 8:
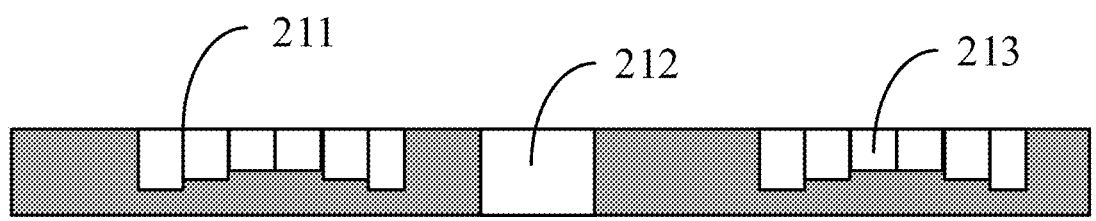
FIG. 8 is a schematic diagram of a structure of a first groove and a second groove according to some exemplary embodiments.

FIG. 8 is a schematic diagram of a structure of a first groove and a second groove according to some exemplary embodiments. As shown in FIG. 8, exemplarily, in a direction parallel to the bending axis M, a depth of the first groove 211 may gradually increase from a middle position of the first groove 211 to two ends of the first groove, and a depth of the second groove 213 may gradually increase from a middle position of the second groove 213 to two ends of the second groove. Thus, the depths of the first groove 211 and the second groove 213 are configured to gradually increase from the middle positions to the two ends thereof, which is conducive to releasing the stress in the bent region 201 and ensuring the mechanical strength at the first groove 211 and the second groove 213.

Exemplarily, a distance between the first groove 211 and the through hole 212 may be smaller than a length of the first groove 211 in a direction parallel to the bending axis M, and a distance between the second groove 213 and the through hole 212 may be smaller than a length of the second groove 213 in a direction parallel to the bending axis M. In this way, it is conducive to releasing the stress in the bent region 201.

Exemplarily, the through hole 212 may be circular, and a diameter of the through hole 212 may be larger than the widths of the first groove 211 and the second groove 213 in the direction perpendicular to the bending axis M, and less than the lengths of the first groove 211 and the second groove 213 in the direction parallel to the bending axis M. Exemplarily, the first groove 211 and the second groove 213 are both rectangular grooves, the first groove 211 and the second groove 213 may have a length of 6 mm, and a width of 2 mm, and the diameter of the through hole may be 3 mm.

Alternatively, the through hole 212 may be elliptical, and the major and minor axes of the through hole 212 may both be larger than the width of the first groove 211 and the second groove 213 in the direction perpendicular to the bending axis M and smaller than the length of the first groove 211 and the second groove 213 in the direction parallel to the bending axis M. Exemplarily, a direction of the major axis of the through hole 212 may be perpendicular to the bending axis M so as to facilitate bending. The first groove 211 and the second groove 213 may both be rectangular grooves, the first groove 211 and the second groove 213 may have a length of 6 mm, a width of 2 mm, the major axis of the through hole may be 4 mm, and the minor axis of the through hole may be 3 mm.

Figure 9:
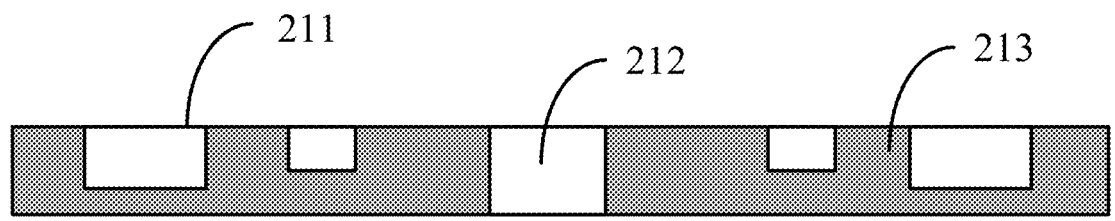
FIG. 9 is a schematic diagram of another structure of a first groove and a second groove according to some exemplary embodiments.

FIG. 9 is a schematic diagram of another structure of a first groove and a second groove according to some exemplary embodiments. As shown in FIG. 9, in some exemplary embodiments, the multiple openings may include multiple grooves sequentially disposed along the direction of the bending axis, and in a direction parallel to the bending axis, a depth of the groove near an edge position of the bent region may be greater than a depth of the groove near a middle position of the bent region. This is conducive to releasing the stress in the bent region and ensuring the mechanical strength of the bent region.

Figure 7A:
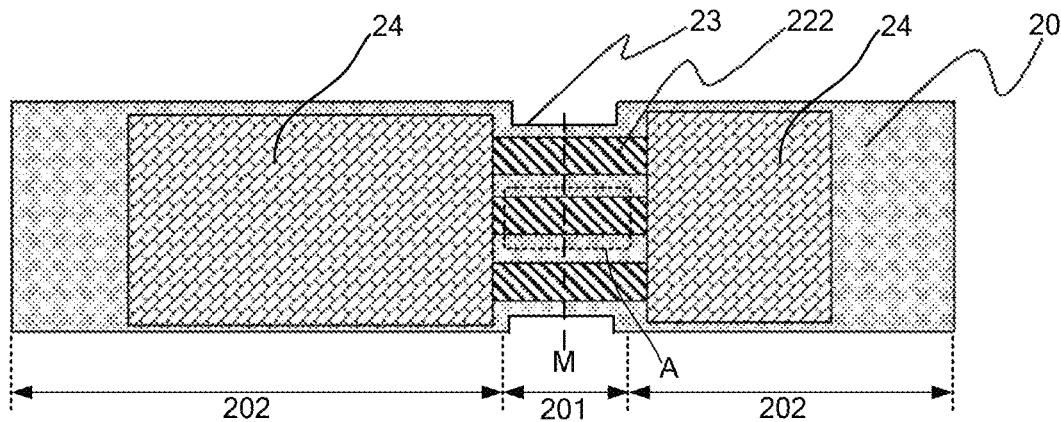
FIG. 7a is a schematic diagram of a planar structure of a flexible circuit board of the display module of FIG. 1 according to some other exemplary embodiments.

In some exemplary embodiments, as shown in FIG. 7a, FIG. 7a is a schematic diagram of a planar structure of a flexible circuit board of the display module of FIG. 1 according to some other exemplary embodiments. A notch 23 is provided at a position where an edge of the bent region 201 intersects with the bending axis M. The notch 23 may be symmetrically disposed with respect to the bending axis M. In this way, the flexible circuit board 20 may release stress through the notch 23 after bending, which is conducive to the bending of the flexible circuit board 20, and ensures good signal transmission of the flexible circuit board 20 without damaging the flexible circuit board 20.

Exemplarily, a shape of the notch 23 may include any one or more of a rectangle, a semicircle, and a trapezoid. A distance between the notch 23 and the traces of the bent region 201 may be smaller than a width of the notch 23 in the direction parallel to the bending axis M, and it is avoided that the distance is too close to damage the traces of the bent region 201 when the notch 23 is formed.

In an example of this embodiment, as shown in FIG. 7a, a notch 23 is provided at a position where the edge of either side of the bent region 201 intersects with the bending axis M, a shape of the notch 23 is rectangular, the notch 23 is disposed symmetrically with respect to the bending axis M, and a width of the notch 23 in a direction parallel to the bending axis M may be smaller than a length in a direction perpendicular to the bending axis M, thus facilitating bending and releasing the stress. The traces of the bent region 201 may include at least one straight line 222 disposed perpendicular to the bending axis M, and the straight line 222 does not overlap with the opening. A distance between the notch 23 and the straight line 222 may be smaller than a width of the notch 23 in the direction parallel to the bending axis M.

Figure 7B:
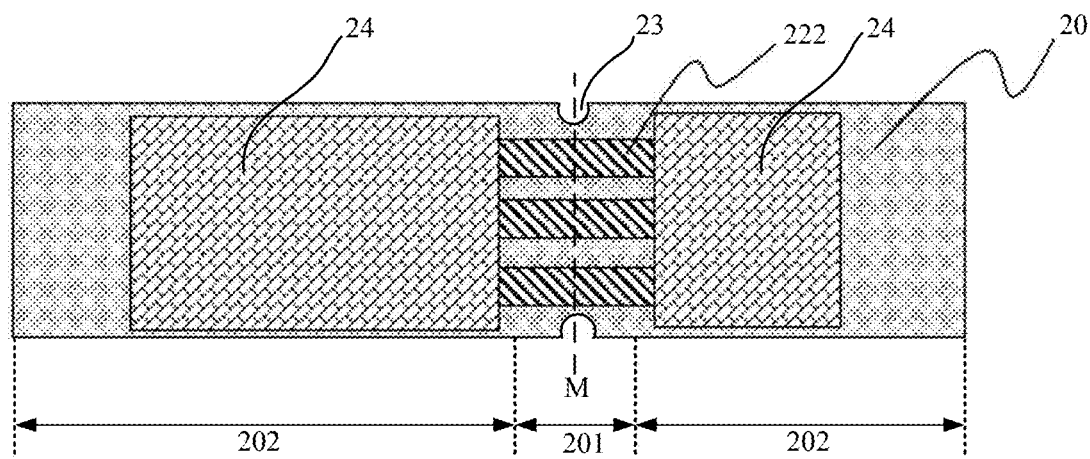
FIG. 7b is a schematic diagram of a planar structure of a flexible circuit board of the display module of FIG. 1 according to some other exemplary embodiments.

In another example of the present embodiment, as shown in FIG. 7b, FIG. 7b is a schematic diagram of a planar structure of a flexible circuit board of the display module of FIG. 1 according to some other exemplary embodiments. A notch 23 is provided at a position where an edge of either side of the bent region 201 intersects the bending axis M, a shape of the notch 23 is semicircular, and the notch 23 is symmetrically disposed with respect to the bending axis M. The traces of the bent region 201 may include at least one straight line 222 disposed perpendicular to the bending axis M, and the straight line 222 does not overlap with the opening.

In some exemplary embodiments, as shown in FIG. 7a, the bent region 201 may be provided with one or more wiring layers, which may be provided according to actual requirements of wiring. When the bent region 201 is provided with multiple wiring layers, a local area (such as a middle area A) of the bent region 201 may be disposed as a wiring layer, so as to reduce the stress after bending of the flexible circuit board, thereby facilitating the bending of the flexible circuit board. The openings may be provided in an area where the multiple wiring layers are located in the bent region 201.

An embodiment of the present disclosure further provides a display device, which includes the display module described in any of the aforementioned embodiments. The display device may be a near-eye display device, such as VR glasses, a helmet display, etc.; or, the display device may be any product or component with a display function, such as a mobile phone, a tablet computer, a television, a display, a notebook computer, a digital photo frame, and a navigator.

In the accompanying drawings, a size of a constituent element, and a thickness of a layer or a region are sometimes exaggerated for clarity. Therefore, one implementation of the present disclosure is not necessarily limited to the size, and the shape and size of each component in the drawings do not reflect an actual scale. In addition, the drawings schematically illustrate some examples, and one implementation of the present disclosure is not limited to the shapes or numerical values shown in the drawings.

In the description herein, "parallel" refers to a state in which an angle formed by two straight lines is above −10° and below 10°, and thus also includes a state in which the angle is above −5° and below 5°. In addition, "vertical" refers to a state in which an angle formed by two straight lines is above 80° and below 100°, and thus also includes a state in which the angle is above 85° and below 95°.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the description herein, unless otherwise specified and defined explicitly, terms "connection", "fixed connection", "installation" and "assembly" should be understood in a broad sense, and, for example, may be a fixed connection, a detachable connection or an integrated connection; terms "installation", "connection" and "fixed connection" may be a direct connection, an indirect connection through intermediate components, or internal communication between two components. For those ordinarily skilled in the art, meanings of the above terms in the embodiments of the present disclosure may be understood according to situations.

The invention claimed is:

1. A display module, comprising a display substrate and a flexible circuit board bonding-connected with the display substrate, wherein:
    the flexible circuit board is bent to a side of the display substrate away from a display side;
    the flexible circuit board comprises a bent region and non-bent regions located at two sides of the bent region; the bent region comprises a bending axis, the flexible circuit board is bent along the bending axis, the bent region is provided with one or more openings at a position on the bending axis, and the one or more openings are through holes penetrating the flexible circuit board or grooves not penetrating the flexible circuit board;
    the bent region comprises at least one wiring layer, the wiring layer of the bent region comprises a plurality of traces extending to the non-bent regions on the two sides of the bent region, and the plurality of traces do not overlap with the one or more openings;
    a shape of the one or more openings comprises any one or more of a circle, an ellipse, a rectangle, and a hexagon, and the one or more openings are disposed symmetrically with the bending axis as a symmetrical axis;
    a plurality of openings are provided, the plurality of openings comprise a first groove, a through hole, and a second groove that are sequentially disposed along the direction of the bending axis; and a length of each of the first groove and the second groove in a direction parallel to the bending axis is greater than a width of each of the first groove and the second groove in a direction perpendicular to the bending axis; and
    a depth of the first groove gradually increases from a middle position of the first groove to two ends of the first groove, and a depth of the second groove gradually increases from a middle position of the second groove to two ends of the second groove in the direction parallel to the bending axis.

2. The display module according to claim 1, wherein a trace comprises a first straight-line segment, an intermediate segment and a second straight-line segment that are sequentially connected with each other, the first straight-line segment and the second straight-line segment are both disposed perpendicular to the bending axis, and the intermediate segment is located at a periphery of an opening;
    a straight line perpendicular to the bending axis and passing through a geometric center of the opening is taken as a central axis of the opening, the plurality of traces symmetrically disposed with respect to the central axis of the opening are taken as a group of traces, and the plurality of traces in each group do not overlap.

3. The display module according to claim 2, wherein the intermediate segment is a polyline or an arc.

4. The display module according to claim 2, wherein a distance between two adjacent groups of traces is greater than a distance between adjacent traces in each group of traces in a direction parallel to the bending axis.

5. The display module according to claim 1, wherein a distance between the first groove and the through hole is smaller than a length of the first groove in the direction parallel to the bending axis, and a distance between the second groove and the through hole is smaller than a length of the second groove in the direction parallel to the bending axis.

6. The display module according to claim 1, wherein the through hole is circular in shape, a diameter of the through hole is larger than the width of each of the first groove and the second groove in the direction perpendicular to the bending axis and smaller than the length of each of the first groove and the second groove in the direction parallel to the bending axis; or, the through hole is elliptical in shape, and both a major axis and a minor axis of the through hole are larger than the width of each of the first groove and the second groove in the direction perpendicular to the bending axis and smaller than the length of each of the first groove and the second groove in the direction parallel to the bending axis.

7. The display module according to claim 1, wherein a notch is provided at a position where an edge of the bent region intersects the bending axis, the notch is symmetrically disposed with respect to the bending axis, and a shape of the notch comprises any one or more of a rectangle, a semicircle, and a trapezoid.

8. The display module according to claim 7, wherein the notch has a rectangular shape and a width of the notch in the direction parallel to the bending axis is smaller than a length of the notch in the direction perpendicular to the bending axis.

9. The display module according to claim 7, wherein a distance between the notch and the traces is smaller than a width of the notch in the direction parallel to the bending axis.

10. The display module according to claim 1, wherein the plurality of traces comprise at least one straight line disposed perpendicular to the bending axis.

11. A display device, comprising the display module according to claim 1.

12. A display module, comprising a display substrate and a flexible circuit board bonding-connected with the display substrate, wherein:
    the flexible circuit board is bent to a side of the display substrate away from a display side;
    the flexible circuit board comprises a bent region and non-bent regions located at two sides of the bent region; the bent region comprises a bending axis, the flexible circuit board is bent along the bending axis, the bent region is provided with one or more openings at a position on the bending axis, and the one or more openings are through holes penetrating the flexible circuit board or grooves not penetrating the flexible circuit board;
    the bent region comprises at least one wiring layer, the wiring layer of the bent region comprises a plurality of traces extending to the non-bent regions on the two sides of the bent region, and the plurality of traces do not overlap with the one or more openings;
    a shape of the one or more openings comprises any one or more of a circle, an ellipse, a rectangle, and a hexagon, and the one or more openings are disposed symmetrically with the bending axis as a symmetrical axis; and a plurality of openings are provided, the plurality of openings comprise a plurality of grooves sequentially disposed along the direction of the bending axis, and in the direction parallel to the bending axis, a depth of a groove near an edge position of the bent region is greater than a depth of the groove near a middle position of the bent region.

* * * * *